(12) United States Patent
Kuramori et al.

(10) Patent No.: US 7,570,106 B2
(45) Date of Patent: Aug. 4, 2009

(54) SUBSTRATE VOLTAGE GENERATING CIRCUIT WITH IMPROVED LEVEL SHIFT CIRCUIT

(75) Inventors: Bunsho Kuramori, Tokyo (JP); Mitsunori Murakami, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 649 days.

(21) Appl. No.: 10/670,773

(22) Filed: Sep. 26, 2003

(65) Prior Publication Data

US 2004/0141381 A1 Jul. 22, 2004

Related U.S. Application Data

(60) Provisional application No. 60/413,770, filed on Sep. 27, 2002.

(51) Int. Cl.
*H02M 3/07* (2006.01)
*G05F 1/575* (2006.01)
*H03K 19/0185* (2006.01)

(52) U.S. Cl. .................. 327/537; 327/333; 327/536; 326/68

(58) Field of Classification Search ............ 327/215, 327/219, 333, 374, 376, 377, 536, 537, 534; 365/189.11, 226; 326/17, 68, 81
See application file for complete search history.

(56) References Cited

U.S. PATENT DOCUMENTS 5,075,581 A * 12/1991 Kamata ................. 326/67

| 6,198,341 | B1 | 3/2001 | Ryu |
| 6,249,145 | B1 | 6/2001 | Tanaka et al. |
| 6,442,082 | B2 * | 8/2002 | Taura et al. ............ 365/189.11 |
| 6,642,769 | B1 * | 11/2003 | Chang et al. ................. 327/333 |
| 6,696,858 | B2 * | 2/2004 | Tokai ........................... 326/68 |
| 6,700,426 | B2 * | 3/2004 | Brox et al. ................... 327/306 |
| 6,731,273 | B2 * | 5/2004 | Koyama et al. ............. 345/204 |
| 6,741,118 | B2 * | 5/2004 | Uchikoba et al. ........... 327/541 |
| 7,091,767 | B2 * | 8/2006 | Tanaka et al. ............... 327/333 |

FOREIGN PATENT DOCUMENTS

JP     2000-067578     3/2000

* cited by examiner

*Primary Examiner*—Lincoln Donovan
*Assistant Examiner*—Terry L Englund
(74) *Attorney, Agent, or Firm*—Studebaker & Brackett PC; Donald R. Studebaker

(57) ABSTRACT

A substrate voltage generating circuit including level shifting circuits, a first power supply node of a first potential level $V_{DD}$ a second power supply node of a second potential level $V_{SS}$ lower than the first potential level, and an output node OUT-.vbb having a third potential level $V_{BB}$ lower than the second potential level. The level shifting circuits are coupled between the first power supply node and the output node, receiving an input signal having the first and second potential levels, and outputting an output signal $V_{BB}$ having the first potential level and the third potential level. The substrate voltage generating circuit also includes a switch circuit connecting the second power supply node to the output node in response to the output signal $V_{BB}$

5 Claims, 3 Drawing Sheets

US 7,570,106 B2

SUBSTRATE VOLTAGE GENERATING CIRCUIT WITH IMPROVED LEVEL SHIFT CIRCUIT

BACKGROUND OF THE INVENTION

Field of the Invention

The present invention relates to a substrate voltage generating circuit. This application claims priority under 35 USC §119 (e) (1) of provisional application No. 60/413,770 filed Sep. 27, 2002.

DESCRIPTION OF THE RELATED ART

With a dynamic random access memory (hereinafter referred to as a DRAM), a substrate voltage generating circuit for generating a negative voltage is generally incorporated on top of a DRAM chip for the following reasons.

A first reason is to prevent PN junctions in memory chips from being partially forward biased, thereby preventing data destruction of memory cells, occurrence of a latch up phenomenon, and so forth. A second reason is to reduce variation in threshold voltage of MOS transistors, due to a body effect, thereby achieving stability in circuit operation. A third reason is to raise the threshold voltages of parasitic MOS transistors. A fourth reason is to cause PN junction capacitance to be reverse biased, thereby achieving a higher speed of circuit operation.

However, a conventional substrate voltage generating circuit has had a problem in that it is unable to generate a substrate voltage as desired. This is due to delay in operation of a level shift circuit, which is a constituent of the substrate voltage generating circuit. Further, the conventional substrate voltage generating circuit has had another problem of large power consumption. This is due to flow of penetrating current in the level shift circuit, which is the constituent of the substrate voltage generating circuit. Furthermore, the conventional substrate voltage generating circuit has had still another problem in that a circuit area is large. This is due to the fact that a layout area of the level shift circuit, the constituent of the substrate voltage generating circuit, needs to be enlarged.

SUMMARY OF THE INVENTION

According to one aspect of the present invention, there is provided a substrate voltage generating circuit which includes a first power supply node supplied with a first potential level; a second power supply node supplied with a second potential level lower than the first potential level; an output node receiving a voltage having a third potential level lower than the second potential level; a level shift circuit which is coupled between the first power supply node and the output node, which receives an input signal having the first and second potential levels, and which outputs an output signal having the first potential level and the third potential level; and a switch circuit which connects the second power supply node to the output node in response to the output signal.

The above novel features of the invention will more fully appear from the following detailed description, appended claims and the accompanying drawings.

DETAILED DESCRIPTION OF THE PREFERRED EMBODIMENTS

Figure 1:
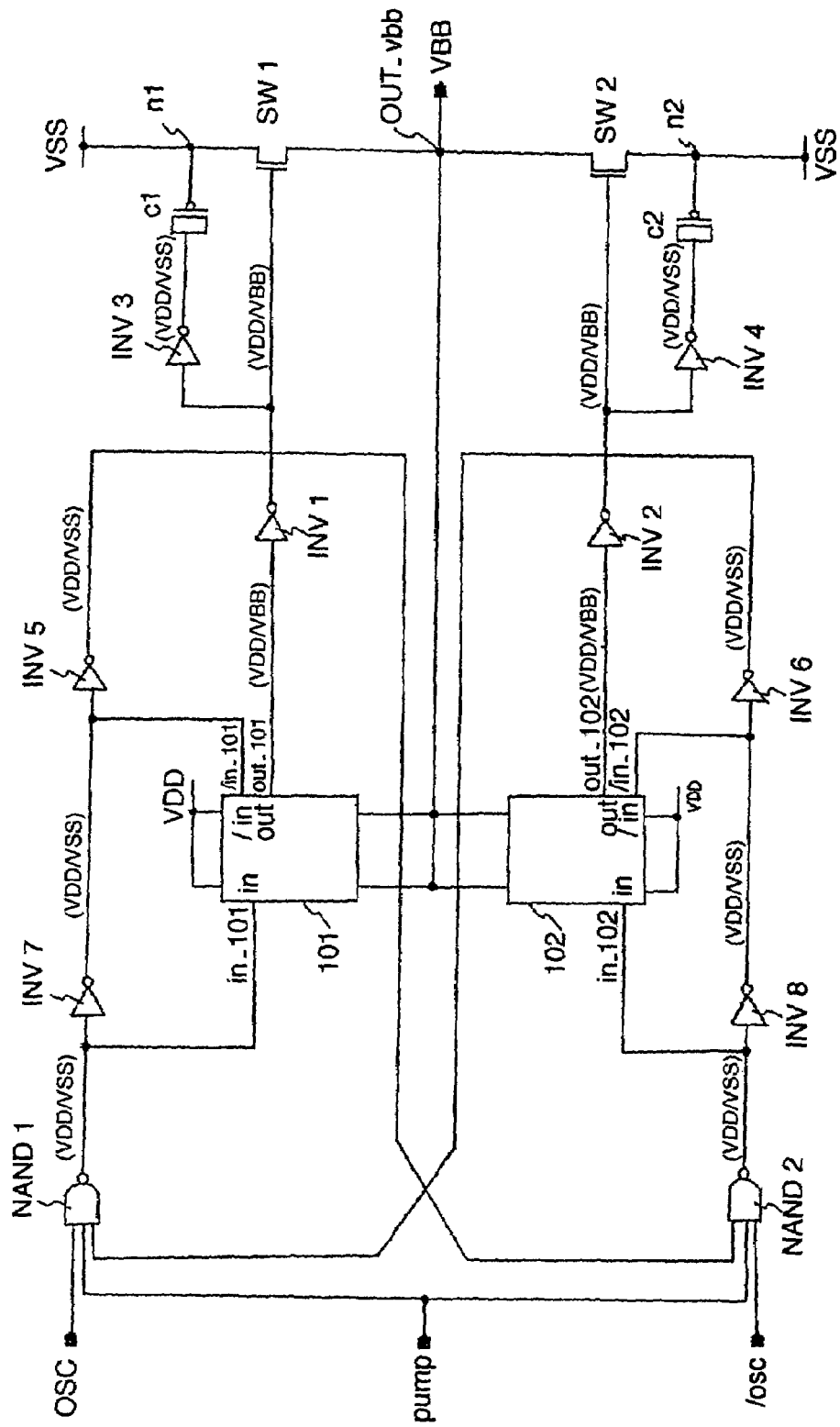
FIG. 1 is a circuit diagram showing a configuration of a substrate voltage generating circuit according to a first embodiment of the present invention.

A substrate voltage generating circuit according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

FIG. 1 is a circuit diagram showing a configuration of a substrate voltage generating circuit according to a first embodiment of the invention. The substrate voltage generating circuit according to the first embodiment of the invention comprises an output node OUT.vbb from which a substrate voltage VBB is outputted, level shift circuits 101, 102 which invert a voltage level of an input signal and output the inverted input signal, a switch element SW1 which is subjected to an on-off control in response to an output signal of the level shift circuit 101, a switch element SW2 which is subjected to an on-off control in response to an output signal of the level shift circuit 102, a capacitance element C1 which effects charging and discharging in response to the output signal of the level shift circuit 101, and a capacitance element C2 which effects charging and discharging in response to the output signal of the level shift circuit 102.

The level shift circuit 101 is connected between a first power supply node to which a power supply voltage VDD (first power voltage) is supplied, and the output node OUT.vbb. An input signal in.101 (first input signal) is supplied, to an input terminal IN of the level shift circuit 101 and an input signal /in.101 (second input signal), which is complementary to the input signal in.101, is supplied to an input terminal /IN. The input signal in.101 and the input signal /in.101 are signals each having an amplitude ranging from a power supply voltage VDD to a power supply voltage VSS (hereinafter referred to as VDD/VSS). For example, the power supply voltage VDD is set to 3.0 V and the power supply voltage VSS is set to 0V. An output signal out.101 is outputted from an output terminal OUT of the level shift circuit 101. The output signal out.101 a signal having the amplitude ranging from a power supply voltage VDD to a substrate voltage VBB (hereinafter referred to as VDD/VBB). The substrate voltage VBB is a negative voltage which is lower than the power supply voltage VSS. For example, the substrate voltage VBB is set to −1.5V.

An input terminal of an inverter circuit INV1 is connected to the output terminal OUT of the level shift circuit 101, and an output terminal thereof is connected to the switch element SW1. An output signal of the inverter circuit INV1 is a signal having an amplitude of VDD/VBB. The switch element SW1 is made up of an n-channel MOS transistor (hereinafter referred to as NMOS transistor). A control electrode (gate) of the NMOS transistor constituting the switch element SW1 is connected to the output terminal of the inverter circuit INV1, a first electrode thereof is connected to a node n1, and a second electrode thereof is connected to the output node OUT.vbb. The node n1 is connected to a second power supply node to which the power supply voltage VSS (second power supply voltage) is supplied.

An input terminal of an inverter circuit INV3 is connected to an output terminal of the inverter circuit INV1 and an output terminal thereof is connected to the capacitance element C1. An output signal of the inverter circuit INV3 is a signal having an amplitude of VDD/VSS. The capacitance element C1 is connected between the node n1 and the output terminal of the inverter circuit INV3.

The level shift circuit 102 is connected between the first power supply node to which the power supply voltage VDD (first power voltage) is supplied, and the output node OUT-.vbb. An input signal in.102 (first input signal) is supplied to an input terminal IN of the level shift circuit 102 and an input signal /in.102, which is complementary to the input signal in.102, is supplied to an input terminal /IN thereof. The input signal in.102 and the input signal /in.102 are signals each having an amplitude of VDD/VSS. An output signal out.102 is outputted from an output terminal OUT of the level shift circuit 102. The output signal out.102 is a signal having an amplitude of VDD/VBB.

An input terminal of an inverter circuit INV2 is connected to the output terminal OUT of the level shift circuit 102, and an output terminal thereof is connected to the switch element SW2. An output signal of the inverter circuit INV2 is a signal having an amplitude of VDD/VBB. The switch element SW2 is made up of an NMOS transistor. A control electrode (gate) of the NMOS transistor constituting the switch element SW2 is connected to the output terminal of the inverter circuit INV2, a first electrode thereof is connected to a node n2, and a second electrode thereof is connected to the output node OUT.vbb. The node n2 is connected to a second power supply node to which the power supply voltage VSS is supplied.

An input terminal of an inverter circuit INV4 is connected to the output terminal of the inverter circuit INV2 and an output terminal thereof is connected to the capacitance element C2. An output signal of the inverter circuit INV4 has an amplitude of VDD/VSS. The capacitance element C2 is connected between the node n2 and the output terminal of the inverter circuit INV4.

An output signal osc of an oscillator circuit (not shown) is supplied to a first input terminal of a NAND 1 circuit, a power down signal pump is supplied to a second input terminal thereof, and an output signal of an inverter circuit INV6 is supplied to a third input terminal thereof. The NAND 1 circuit outputs an inverting signal of a logical product (AND). An output signal of the NAND 1 circuit is a signal having an amplitude of VDD/VSS.

An output signal /osc of an oscillator circuit (not shown) is supplied to a first input terminal of a NAND 2 circuit, the power down signal pump is supplied to a second input terminal thereof, and an output signal of an inverter circuit INV5 is supplied to a third input terminal thereof. The output signal /osc is a signal having a phase opposite to the output signal osc supplied to the first input terminal of the NAND 1 circuit. The NAND 2 outputs an inverting signal of the logical product (AND). An output signal of the NADN 2 is a signal having an amplitude of VDD/VSS.

An input terminal of an inverter circuit INV7 is connected to an output terminal of the NAND 1 circuit and an output terminal thereof is connected to the input terminal /IN of the level shift circuit 101. An output signal of the inverter circuit INV7 is a signal having an amplitude of VDD/VSS. An input terminal of an inverter circuit INV8 is connected to an output terminal of the NAND 2 circuit, and an output terminal thereof is connected to the input terminal /IN of the level shift circuit 102. An output signal of the inverter circuit INV8 is a signal having an amplitude of VDD/VSS.

Figure 2:
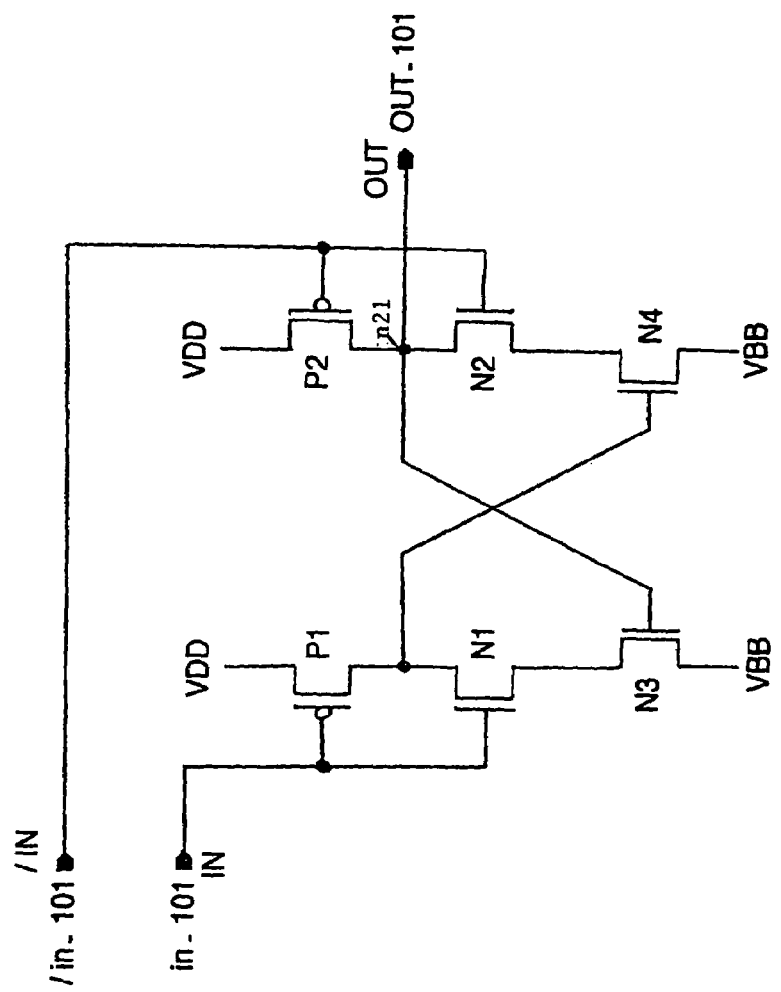
FIG. 2 is a circuit diagram showing a configuration of a level shift circuit.

The configuration of the level shift circuit 101 is now described with reference to FIG. 2. FIG. 2 is a circuit diagram showing the configuration of the level shift circuit 101. The level shift circuit 101 comprises p-channel MOS transistors (hereinafter referred to as PMOSs) P1 (first transistor) and P2 (second transistor), n-channel MOS transistors (hereinafter referred to as NMOSs) N1 (third transistor), N2 (fourth transistor), N3 (fifth transistor) and N4 (sixth transistor). The PMOS transistor P1 has a gate to which the input signal in.101 is supplied, a source connected to the first power supply node to which the power supply voltage VDD is supplied, and a drain. The PMOS transistor P2 has a gate to which the input signal /in.101 having a phase opposite to the input signal in.101 is supplied, a source connected to the first power supply node to which the power supply voltage VDD is supplied, and a drain connected to a node n21 (first node). The NMOS transistor N1 has a gate to which the input signal in.101 is supplied, a source connected to the NMOS transistor N3, and a drain connected to the drain of the PMOS transistor P1. The NMOS transistor N2 has a gate to which the input signal /in.101 is supplied, a source connected to the NMOS transistor N4, and a drain connected to the drain of the PMOS transistor P2. The NMOS transistor N3 has a gate connected to the node n21, a source connected to the output node OUT-.vbb, and a drain connected to the source of the NMOS transistor N1. The NMOS transistor N4 has a gate connected to the drain of the PMOS transistor P1, a source connected to the output node OUT.vbb, and a drain connected to the source of the NMOS transistor N2. The node n21 is connected to the output terminal OUT.

The thickness of gate oxide films of the NMOS transistors N1 and N2 are thicker than those of the NMOS transistors N3 and N4. The above thickness relationship between these NMOS transistors is required in order that the NMOS transistors N1 and N2 function as resistance elements sufficiently.

The level shift circuit 102 has the same configuration of the level shift circuit 101 shown in FIG. 2, and also has the input terminal IN to which the input signal in.102 is supplied and the input terminal /IN to which the input signal /in.102 is supplied.

An operation of the substrate voltage generating circuit according to the first embodiment of the invention is now described. When the substrate voltage generating circuit is active (operative), the power down signal pump holds "H". The signal osc is the output signal of the oscillator circuit (not shown) and it is alternately repeated between "H" and "L". The signal /osc is an inverting signal of the signal osc and it is alternately repeated between "L" and "H".

Described first is an operation in the case where the signal osc is "H" and the signal /osc is "L". The signal osc of "H", the power down signal pump of "H", and the output signal of "H" of the inverter circuit INV6 are supplied to the input terminal of the NAND 1 circuit respectively, so that the output signal (input signal in.101) of the NAND 1 circuit goes "L" (power supply voltage VSS). The inverter circuit INV7 inverts the input signal of "L" and outputs the signal (input signal /in.101) of "H" (power supply voltage VDD). The level shift circuit 101 outputs the output signal out.101 of "L" (substrate voltage VBB) in response to the input signal in.101 of "L" (power supply voltage VSS) and the input signal /in.101 of "H" (power supply voltage VDD).

An operation of the level shift circuit 101 is described next with reference to FIG. 2. When the input signal in.101 of "L" (power supply voltage VSS) is supplied to the input terminal IN, the PMOS transistor P1 turns ON. At this time, since the substrate voltage VBB is supplied to the source of the NMOS transistor N1, the NMOS transistor N1 does not turn ON completely and functions as a resistance element. Further, since the thickness of the gate oxide film of the NMOS transistor N1 is set to a thickness thicker than those of the NMOS transistors N3 and N4, the NMOS transistor N1 has relatively high resistance value at this time period.

Since the input signal /in.101 of "H" (power supply voltage VDD) is supplied to the input terminal /IN, the PMOS transistor P2 turns OFF, and hence the NMOS transistor N2 turns ON. Since the NMOS transistor N1 functions as the resistance element, the signal of "H" (power supply voltage VDD) is instantaneously supplied to the gate of the NMOS transistor N4, and hence the NMOS transistor N4 turns ON. This means that the level shift circuit 101 operates rapidly. Since the NMOS transistor N4 turns ON, the voltage of the output terminal OUT goes "L" (substrate voltage VBB). Since the voltage of the output terminal OUT goes "L" (substrate voltage VBB), the NMOS transistor N3 turns OFF. In such a manner, the output signal out.101 of "L" (substrate voltage VBB) is outputted from the output terminal OUT of the level shift circuit 101.

The inverter circuit INV1 outputs the signal of "H" (power supply voltage VDD) in response to the signal of "L" (substrate voltage VBB). The inverter circuit INV3 outputs the signal of "L" (power supply voltage VSS) in response to the signal of "H" (power supply voltage VDD). At this time, the node n1 goes "L", i.e. the substrate voltage VBB level by the capacitance element C1. The switch element SW1 turns ON in response to the signal "H" (power supply voltage VDD). When the switch element SW1 turns ON, the substrate voltage VBB is transferred to the output node OUT.vbb.

At this time, the signal /osc of "L", the power down signal pump of "H", and the output signal of "L" of the inverter circuit INV5 are supplied to the input terminal of the NAND 2 circuit respectively, so that the output signal (input signal in.102) of the NAND 2 circuit goes "H" (power supply voltage VDD). The inverter circuit INV8 inverts the input signal of "H" and outputs the signal (input signal /in.102) of "L" (power supply voltage VSS). The level shift circuit 102 outputs the output signal out.102 of "H" (power supply voltage VDD) in response to the input signal in.102 of "H" (power supply voltage VDD) and the input signal /in.102 of "L" (power supply voltage VSS).

An operation of the level shift circuit 102 is described next with reference to FIG. 2. When the input signal in.102 of "H" (power supply voltage VDD) is supplied to the input terminal IN, the PMOS transistor P1 turns OFF and the NMOS transistor N1 turns ON. Since the input signal /in.102 of "L" (power supply voltage VSS) is supplied to the input terminal /IN, the PMOS transistor P2 turns ON. At this time, since the substrate voltage VBB is supplied to the source of the NMOS transistor N2, the NMOS transistor N2 does not turn ON completely, and it functions as a resistance element. Further, since the thickness of the gate oxide film of the NMOS transistor N2 is set to a thickness thicker than those of the NMOS transistors N3 and N4, the NMOS transistor N2 has relatively high resistance value at this time period. Since the NMOS transistor N2 functions as the resistance element, the signal of "H" (power supply voltage VDD) is instantaneously supplied to the gate of the NMOS transistor N3, and hence the NMOS transistor N3 turns ON. This means that the level shift circuit 102 operates rapidly. Since the NMOS transistor N3 turns ON, the signal of "L" (substrate voltage VBB) is supplied to the gate of the NMOS transistor N4, and hence the NMOS transistor N4 turns OFF. In such a manner, the output signal out 102 of "H" (power supply voltage VDD) is outputted from the output terminal OUT of the level shift circuit 102.

The inverter circuit INV2 outputs the signal of "L" (substrate voltage VBB) in response to the signal of "H" (power supply voltage VDD). The inverter circuit INV4 outputs a signal of "H" (power supply voltage VDD) in response to the signal of "L" (substrate voltage VBB). The switch element SW2 turns OFF in response to the signal of "L" (substrate voltage VBB).

Thereafter, since the signal /osc and the signal osc go "L" alternately, the voltage of the nodes n2 and n1 go "L", i.e. the substrate voltage VBB level, and hence the substrate voltage VBB is outputted from the output node OUT.vbb.

As mentioned above, since the substrate voltage generating circuit of the first embodiment of the invention achieves a higher speed of circuit operation of the level shift circuits 101 and 102, a substrate voltage as desired can be generated. Further, since the penetrating current of the level shift circuits 101, 102 can be prevented, the power consumption of the substrate voltage generating circuit can be reduced. Further, since the layout area of the level shift circuits 101, 102 is reduced, the circuit area of the substrate voltage generating circuit can be reduced.

Second Preferred Embodiment

A substrate voltage generating circuit according to a second embodiment of the invention is now described. The substrate voltage generating circuit of the second embodiment is different from that of the first embodiment in that the circuit configurations of the level shift circuits 101, 102 of the first embodiment as described with reference to FIGS. 1 and 2 is changed to the circuit configuration as shown in FIG. 3.

Figure 3:
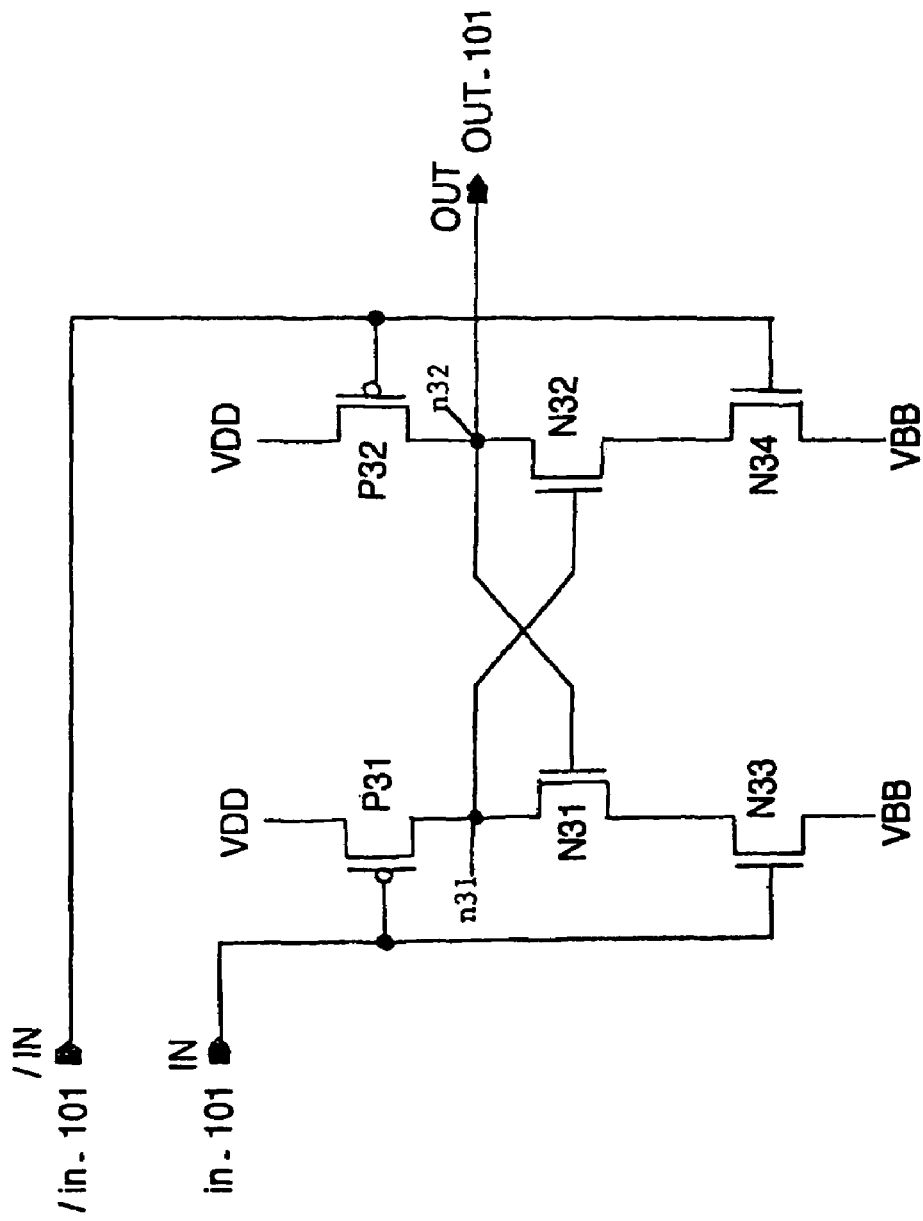
FIG. 3 is a circuit diagram showing a configuration of a level shift circuit according to a second embodiment of the voltage generating circuit of the present invention.

FIG. 3 is a circuit diagram showing the configuration of the level shift circuit according to the second embodiment of the substrate voltage generating circuit of the invention.

The level shift circuit of the substrate voltage generating circuit of the second embodiment of the invention comprises PMOS transistors P31 (first transistor) and P32 (second transistor), and NMOS transistors N31 (third transistor), N32 (fourth transistor), N33 (fifth transistor) and N34 (sixth transistor). The PMOS transistor P31 has a gate to which the input signal in.101 (first input signal) is supplied, a source connected to the first power supply node to which the power supply voltage VDD is supplied, and a drain connected to a node n31 (first node). The PMOS transistor P32 has a gate to which the input signal /in.101 (second input signal) having a phase opposite to the input signal in.101 is supplied, a source connected to the first power supply node to which the power supply voltage VDD is supplied, and a drain connected to the node n32. The NMOS transistor N31 has a gate connected to the node n32, a source connected to the NMOS transistor N33, and a drain connected to the drain of the PMOS transistor P31. The NMOS transistor N32 has a gate connected to the drain of the PMOS transistor P31, a source connected to the NMOS transistor N34, and a drain connected to the output terminal OUT. The NMOS transistor N33 has a gate to which the input signal in.101 is supplied, a source connected to the output node OUT.vbb, and a drain connected to the source of the NMOS transistor N31. The NMOS transistor N34 has a gate to which the input signal /in.101 is supplied, a source connected to the output node OUT.vbb, and a drain connected to the source of the NMOS transistor N32. The node n32 is connected to the output terminal OUT.

The thickness of gate oxide films of the NMOS transistors N33 and N34 are thicker than those of the NMOS transistors N31 and N32. The above thickness relationship between these NMOS transistors is required in order that the NMOS transistors N33 and N34 function as resistance elements sufficiently.

The level shift circuit 102 has the same configuration of the level shift circuit 101 shown in FIG. 3, and also has the input terminal IN to which the input signal in.102 is supplied and the input terminal /IN to which the input signal /in.102 is supplied.

An operation of the substrate voltage generating circuit of the second embodiment is described next. Since the operation of the constituents of the substrate voltage generating circuit other than the level shift circuit are the same as the operation of those of the first embodiment, the operation of the level shift circuit alone is described next.

Described first is an operation in the case where the input signal in.101 of "L" (power supply voltage VSS) is supplied to the input terminal IN, and the input signal /in.101 of "H" (power supply voltage VDD) is supplied to the input terminal /IN. The PMOS transistor P31 turns ON in response to the input signal in.101 of "L" (power supply voltage VSS). At this time, since the substrate voltage VBB is supplied to the source of the NMOS transistor N33, the NMOS transistor N33 does not turn ON completely and functions as a resistance element. Further, since the thickness of the gate oxide film of the NMOS transistor N33 is set to a thickness thicker than those of the NMOS transistors N31 and N32, the NMOS transistor N33 has relatively high resistance value at this time period. Further, the PMOS transistor P32 turns OFF and the NMOS transistor N34 turns ON in response to the input signal /in.101 of "H" (power supply voltage VDD). Since the NMOS transistor N33 functions as the resistance element, the power supply voltage VDD is instantaneously supplied to the gate of the NMOS transistor N32, and hence the NMOS transistor N32 turns ON. This means that the level shift circuit 101 operates rapidly. Since the NMOS transistor N32 turns ON, the voltage of the output terminal OUT goes "L", the substrate voltage VBB. Since the voltage of the output terminal OUT goes "L", i.e. the substrate voltage VBB, the NMOS transistor N31 turns OFF. In such a manner, the substrate voltage VBB is outputted from the output terminal OUT of the level shift circuit.

Described next is an operation in the case where the input signal in.101 of "H" (power supply voltage VDD) is supplied to the input terminal IN, and the input signal /in.101 of "L" (power supply voltage VSS) is supplied to the input terminal IN. The PMOS transistor P31 turns OFF and the NMOS transistor N33 turns ON in response to the input signal in.101 of "H" (power supply voltage VDD). The PMOS transistor P32 turns on in response to the input signal /in.101 of "L" (power supply voltage VSS). Since the substrate voltage VBB is supplied to the source of the NMOS transistor N34, the NMOS transistor N34 does not turn OFF completely and functions as a resistance element. Further, since the thickness of the gate oxide film of the NMOS transistor N34 is set to a thickness thicker than those of the NMOS transistors N31 and N32, the NMOS transistor N34 has relatively high resistance value at this time period. Since the NMOS transistor N34 functions as the resistance element, the power supply voltage VDD instantaneously goes "H", i.e. the power supply voltage VDD level, and hence the NMOS transistor N31 turns ON. This means that the level shift circuit 102 operates rapidly. Since the NMOS transistor N31 turns ON, the substrate voltage VBB is supplied to the gate of the NMOS transistor N32, and hence the NMOS transistor N32 turns OFF. In such a manner, the output signal out.101 of the power supply voltage VDD is outputted from the output terminal OUT of the level shift circuit.

As mentioned above, since the substrate voltage generating circuit of the second embodiment of the invention achieves a higher speed of circuit operation of the level shift circuits 101 and 102, a substrate voltage as desired can be generated. Further, since the penetrating current of the level shift circuits 101, 102 can be prevented, the power consumption of the substrate voltage generating circuit can be reduced. Further, since the layout area of the level shift circuits 101, 102 is reduced, the circuit area of the substrate voltage generating circuit can be reduced.

While the preferred form of the present invention has been described, it is to be understood that modifications will be apparent to those skilled in the art without departing from the spirit of the invention. The scope of the invention is to be determined solely by the following claims.

What is claimed is:

1. A substrate voltage generating circuits comprising:
   a first power supply node supplied with a first potential level;
   a second power supply node supplied with a second potential level lower than the first potential level;
   an output node having a third potential level lower than the second potential level;
   a level shift circuit which is coupled between the first power supply node and the output node, which receives a first input signal and a second input signal complement of the first input signal, and which outputs an output signal having the first potential level and the third potential level; and
   a switch circuit which connects the second power supply node to the output node in response to the output signal;
   wherein the switch circuit includes a switching element, which has a control electrode receiving the output signal, a first electrode connected to the second power supply node, and a second electrode connected to the output node; and
   a capacitor coupled between the first electrode and the control electrode.

2. The substrate voltage generating circuit according to claim 1, wherein the level shift circuit comprises:
   a first transistor of a first conductivity type which has a gate receiving the first input signal, a source connected to the first power supply node, and a drain;
   a second transistor of the first conductivity type which has a gate receiving the second input signal complement of the first input signal, a source connected to the first power supply node, and a drain coupled to the switch circuit;
   a third transistor of a second conductivity type which has a gate connected to the gate of the first transistor, a source, a drain connected to the drain of the first transistor, and a gate oxide film having a first thickness;
   a fourth transistor of the second conductivity type which has a gate connected to the gate of the second transistor, a source, a drain connected to the drain of the second transistor, and a gate oxide film having the first thickness;
   a fifth transistor of the second conductivity type which has a gate connected to the drain of the second transistor, a source connected to the output node, a drain connected to the source of the third transistor, and a gate oxide film having a second thickness thinner than the first thickness; and
   a sixth transistor of the second conductivity type which has a gate connected to the drain of the first transistor, a source connected to the output node, a drain connected to the source of the fourth transistor, and a gate oxide film having the second thickness.

3. The substrate voltage generating circuit according to claim 1, wherein the level shift circuit comprises:
 a first transistor of a first conductivity type which has a gate receiving the first input signal, a source connected to the first power supply node, and a drain;
 a second transistor of the first conductivity type which has a gate receiving the second input signal complement of the first input signal, a source connected to the first power supply node, and a drain coupled to the switch circuit;
 a third transistor of a second conductivity type which has a gate connected to the drain of the second transistor, a source, a drain connected to the drain of the first transistor, and a gate oxide film having a first thickness;
 a fourth transistor of the second conductivity type which has a gate connected to the drain of the first transistor, a source, a drain connected to the drain of the second transistor, and a gate oxide film having the first thickness;
 a fifth transistor of the second conductivity type which has a gate connected to the gate of the first transistor, a source connected to the output node, a drain connected to the source of the third transistor, and a gate oxide film having a second thickness thicker than the first thickness; and
 a sixth transistor of the second conductivity type which has a gate connected to the gate of the second transistor, a source connected to the output node, a drain connected to the source of the fourth transistor, and a gate oxide film having the second thickness.

4. The substrate voltage generating circuit according to claim 1, wherein the second potential level is 0 volt.

5. The substrate voltage generating circuit according to claim 1 wherein the third potential level is a negative voltage level.

* * * * *